United States Patent
Task

(10) Patent No.: US 11,473,197 B2
(45) Date of Patent: Oct. 18, 2022

(54) HPC AND HPT DISKS COATED BY ATOMIC LAYER DEPOSITION

(71) Applicant: United Technologies Corporation, Farmington, CT (US)

(72) Inventor: Michael N. Task, Vernon, CT (US)

(73) Assignee: Raytheon Technologies Corporation, Farmington, CT (US)

(*) Notice: Subject to any disclaimer, the term of this patent is extended or adjusted under 35 U.S.C. 154(b) by 260 days.

(21) Appl. No.: 15/923,419

(22) Filed: Mar. 16, 2018

(65) Prior Publication Data

US 2019/0284693 A1    Sep. 19, 2019

(51) Int. Cl.
| | |
|---|---|
| C23C 16/455 | (2006.01) |
| C23C 16/40 | (2006.01) |
| F01D 5/28 | (2006.01) |
| F01D 5/34 | (2006.01) |
| F01D 25/00 | (2006.01) |
| F01D 5/02 | (2006.01) |

(52) U.S. Cl.
CPC ...... *C23C 16/45553* (2013.01); *C23C 16/403* (2013.01); *C23C 16/405* (2013.01); *C23C 16/45555* (2013.01); *F01D 5/02* (2013.01); *F01D 5/288* (2013.01); *F01D 5/34* (2013.01); *F01D 25/007* (2013.01); *F05D 2220/32* (2013.01); *F05D 2230/314* (2013.01); *F05D 2230/90* (2013.01); *F05D 2300/21* (2013.01); *F05D 2300/2112* (2013.01); *F05D 2300/2118* (2013.01); *F05D 2300/611* (2013.01)

(58) Field of Classification Search
CPC ........ C23C 16/45553; C23C 16/45555; C23C 16/403; C23C 16/405; F05D 2220/32; F05D 2300/21; F05D 2300/2112; F05D 2300/2118
See application file for complete search history.

(56) References Cited

U.S. PATENT DOCUMENTS

| | | | |
|---|---|---|---|
| 6,905,730 | B2 | 6/2005 | Ackerman et al. |
| 7,285,312 | B2 | 10/2007 | Li |
| 2004/0013802 | A1 | 1/2004 | Ackerman et al. |
| 2012/0040084 | A1* | 2/2012 | Fairbourn ............... C23C 16/08 427/8 |
| 2013/0196141 | A1 | 8/2013 | Vassen et al. |
| 2015/0259787 | A1 | 9/2015 | Shim et al. |
| 2016/0017481 | A1 | 1/2016 | Livings et al. |
| 2016/0031186 | A1 | 2/2016 | Mourer et al. |

OTHER PUBLICATIONS

European Search Report dated Jul. 5, 2019 issued for European Patent Application No. 19163307.2.

\* cited by examiner

Primary Examiner — Courtney D Heinle
Assistant Examiner — Danielle M. Christensen
(74) Attorney, Agent, or Firm — Bachman & LaPointe, P.C.

(57) ABSTRACT

A process for coating a gas turbine engine disk comprises placing the disk having an outer surface into a chamber, the chamber configured to perform atomic layer deposition; injecting a first reactant into the chamber; forming a first monolayer gas thin film on the outer surface; removing the first reactant from the chamber; injecting a second reactant into the chamber; reacting second reactant with the first monolayer gas thin film; removing the second reactant from the chamber; and forming a protective barrier coating on the outer surface.

14 Claims, 4 Drawing Sheets

HPC AND HPT DISKS COATED BY ATOMIC LAYER DEPOSITION

BACKGROUND

The present disclosure is directed to a process for coating gas turbine engine high pressure compressor disks and high pressure turbine disks.

Gas turbine engines are required to be more efficient, so as a result the gas temperatures within the engines have been increased. The ability to operate at these increased temperatures is limited by the ability of the components to maintain their mechanical strength when exposed to the heat, oxidation, and corrosive effects of the impinging gas.

Disk materials in the aft end of the high pressure compressor (HPC) of various commercial gas turbine engines have been shown to display salt-induced hot corrosion during service, particularly in polluted areas.

It is desired to protect the disk materials from the hot corrosion.

SUMMARY

In accordance with the present disclosure, there is provided a process for coating a gas turbine engine disk comprising placing the disk having an outer surface into a chamber, the chamber configured to perform atomic layer deposition; injecting a first reactant into the chamber, so as to form a first monolayer gas thin film on the outer surface; removing the first reactant from the chamber; injecting a second reactant into the chamber, so as to react with the first monolayer gas thin film to form a first monolayer solid thin film on the outer surface; removing the second reactant from the chamber; and forming a protective barrier coating on the outer surface.

In another and alternative embodiment, the process further comprises determining a thickness of the protective barrier coating; and repeating the steps of injecting and removing the first reactant and repeating the step of injecting and removing the second reactant responsive to determining the thickness of the protective barrier coating.

In another and alternative embodiment, the process further comprises, prior to injecting the first reactant into the chamber, creating a vacuum in the chamber; and heating the chamber to a predetermined temperature.

In another and alternative embodiment, the predetermined temperature enables the step of forming a first monolayer gas thin film on the internal surfaces and the step of injecting the second reactant to form the monolayer solid thin film.

In another and alternative embodiment, the first reactant comprises an oxide precursor and the second reactant comprises an oxidant.

In another and alternative embodiment, the first monolayer solid thin film and the second monolayer solid thin film form a protective barrier coating comprising $Cr_2O_3$.

In another and alternative embodiment, the first monolayer gas thin film and the second monolayer solid thin film comprise a total thickness of from about 0.1 micron to about 10 microns.

In another and alternative embodiment, the total thickness is configured to reduce a fatigue debit of the disk.

In another and alternative embodiment, the first monolayer gas thin film and the second reactant form the protective barrier coating comprising a material selected from the group consisting of $Al_2O_3$.

In another and alternative embodiment, the outer surface is proximate a rim of the disk.

In another and alternative embodiment, the gas turbine engine disk is selected from the group consisting of a high pressure compressor disk and a high pressure turbine disk.

In accordance with the present disclosure, there is provided a gas turbine engine disk comprising a protective barrier coating formed by the method.

In another and alternative embodiment, the protective barrier coating comprises $Cr_2O_3$.

In another and alternative embodiment, the protective barrier coating is a material selected from the group consisting of $Al_2O_3$.

In another and alternative embodiment, the disk is at least one of a bladed disk and an integrally bladed rotor disk.

In another and alternative embodiment, the protective barrier coating has a thickness configured to minimize a fatigue debit of the disk.

Other details of the process for coating are set forth in the following detailed description and the accompanying drawings wherein like reference numerals depict like elements.

DETAILED DESCRIPTION

Figure 1:
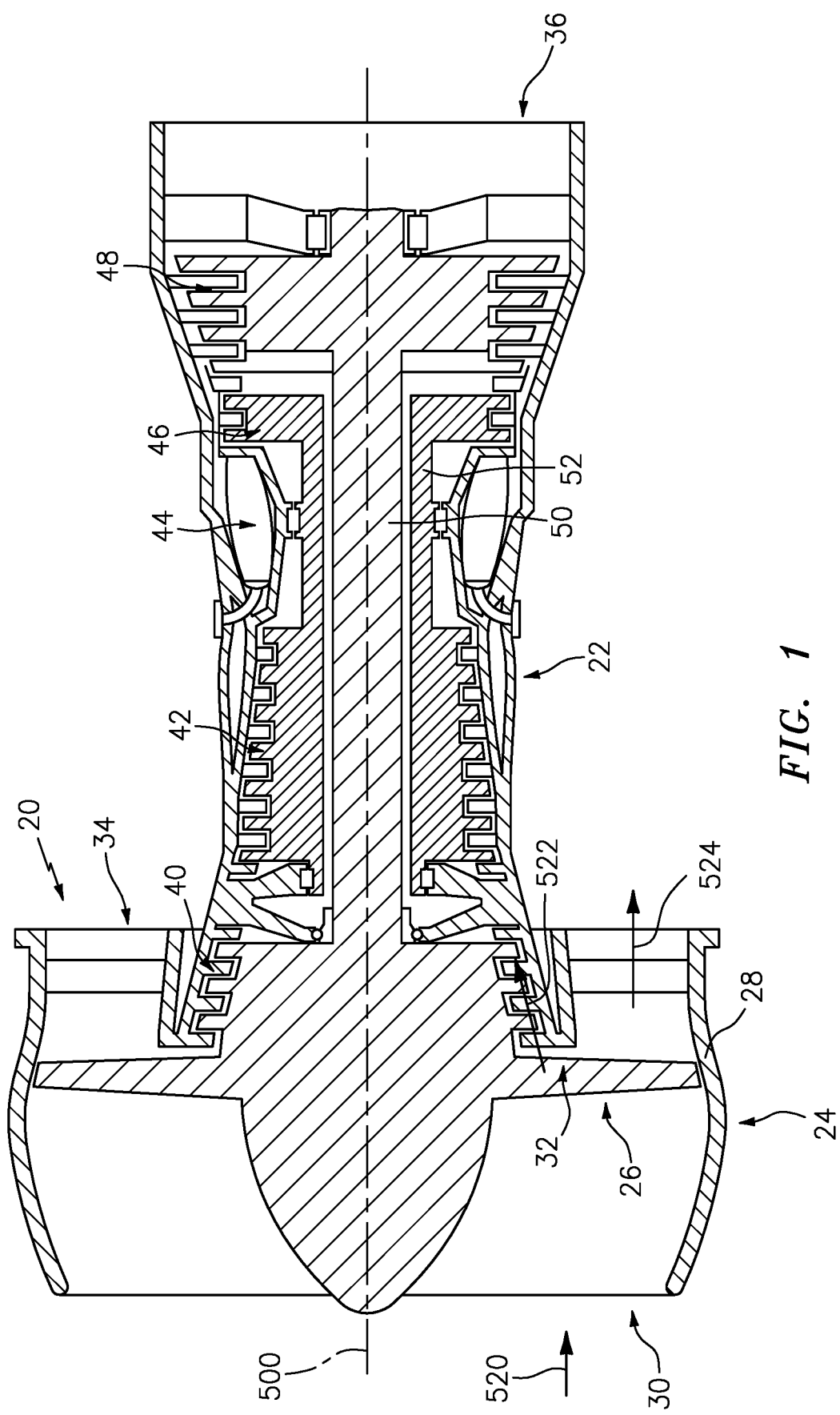
FIG. 1 is a schematic longitudinal sectional view of a turbofan engine.

FIG. 1 shows a gas turbine engine 20 having an engine case 22 surrounding a centerline or central longitudinal axis 500. An exemplary gas turbine engine is a turbofan engine having a fan section 24 including a fan 26 within a fan case 28. The exemplary engine includes an inlet 30 at an upstream end of the fan case receiving an inlet flow along an inlet flow path 520. The fan 26 has one or more stages of fan blades 32. Downstream of the fan blades, the flow path 520 splits into an inboard portion 522 being a core flow path and passing through a core of the engine and an outboard portion 524 being a bypass flow path exiting an outlet 34 of the fan case.

The core flow path 522 proceeds downstream to an engine outlet 36 through one or more compressor sections, a combustor, and one or more turbine sections. The exemplary engine has two axial compressor sections and two axial turbine sections, although other configurations are equally applicable. From upstream to downstream there is a low pressure compressor section (LPC) 40, a high pressure compressor section (HPC) 42, a combustor section 44, a high pressure turbine section (HPT) 46, and a low pressure turbine section (LPT) 48. Each of the LPC, HPC, HPT, and LPT comprises one or more stages of blades which may be interspersed with one or more stages of stator vanes.

In the exemplary engine, the blade stages of the LPC and LPT are part of a low pressure spool mounted for rotation about the axis 500. The exemplary low pressure spool includes a shaft (low pressure shaft) 50 which couples the blade stages of the LPT to those of the LPC and allows the LPT to drive rotation of the LPC. In the exemplary engine, the shaft 50 also directly drives the fan. In alternative implementations, the fan may be driven via a transmission (e.g., a fan gear drive system such as an epicyclical transmission) to allow the fan to rotate at a lower speed than the low pressure shaft.

The exemplary engine further includes a high pressure shaft 52 mounted for rotation about the axis 500 and coupling the blade stages of the HPT to those of the HPC to allow the HPT to drive rotation of the HPC. In the combustor 44, fuel is introduced to compressed air from the HPC and combusted to produce a high pressure gas which, in turn, is expanded in the turbine sections to extract energy and drive rotation of the respective turbine sections and their associated compressor sections (to provide the compressed air to the combustor) and fan.

Figure 2:
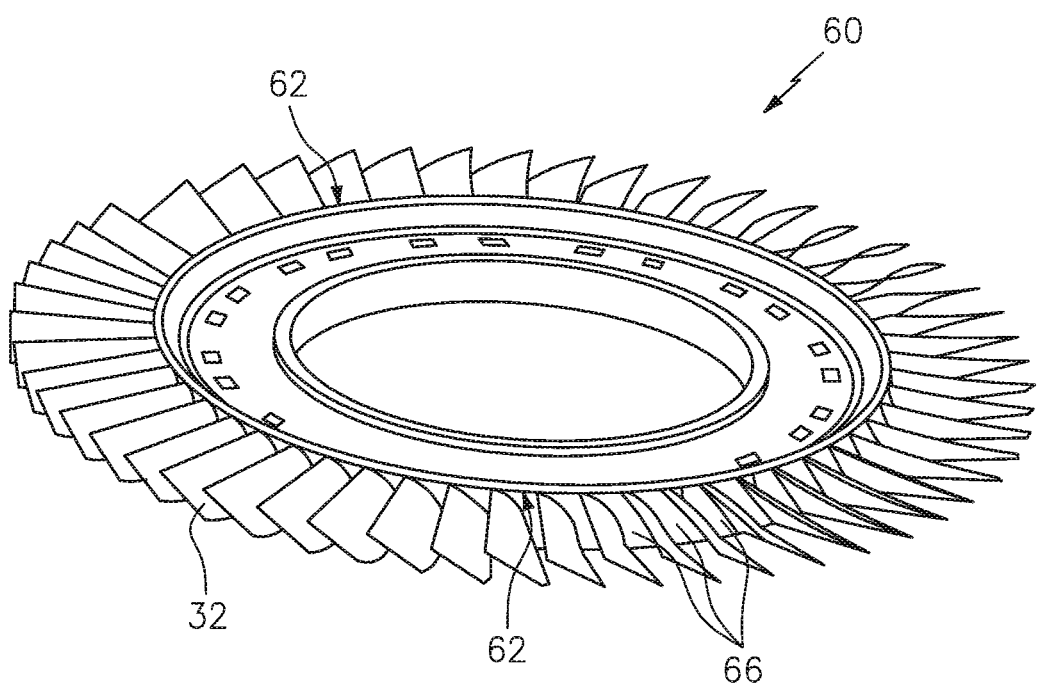
FIG. 2 illustrates a perspective view of an exemplary rotor in accordance with various embodiments.

Referring to FIG. 2 an exemplary disk 60 is illustrated. The exemplary disk 60 shown can be a high pressure compressor disk or a high pressure turbine disk. The disk 60 can be a bladed disk or an integrally bladed rotor disk. The disk 60 is shown with blades 32 inserted proximate a rim 62 of the disk 60. The rim 62 of the disk includes an outer surface 64.

Figure 3:
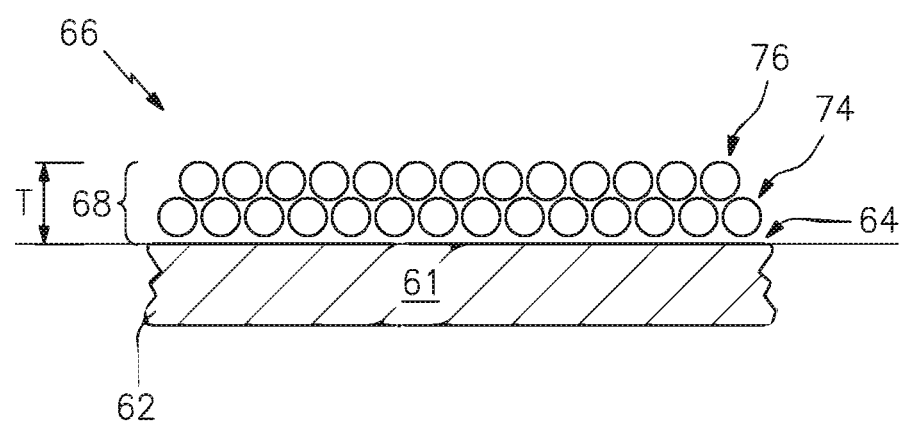
FIG. 3 is a cross-sectional illustration of an exemplary disk coating in accordance with various embodiments.

Referring also to FIG. 3, the disk 60 comprises an alloy substrate 61 and includes coatings that are used for the high temperature structural applications in which the disk 60 is utilized. The disk 60 can include a thermally grown oxide coating for corrosion protection. In an exemplary embodiment the disk 60 can include a protective barrier coating 66 directly on the substrate 61. In an exemplary embodiment the coating can include a protective barrier coating 66 comprising an oxide, such as $Cr_2O_3$. However, disk 60 alloy compositions often cannot be optimized for the purpose of coating because of mechanical property considerations, so the alloys may be borderline $Cr_2O_3$ formers. The result is that oxide scale growth can be inhomogeneous over the disk 60, with certain locations not forming these protective oxides under certain conditions. Also, upon forming the scales, the Cr in the underlying alloy is depleted, so when the scale sustains damage, the alloy may be unable to repair the protective barrier coating 66, resulting in rapid corrosion rates.

In the exemplary process, using ALD to deposit the oxides, the protective barrier coating 66 can be uniformly formed over the entire surface 64 of the disk 60. The exemplary process is functional in non-line-of-sight areas of the disk 60, with no depletion of the elements in the underlying alloy.

Figure 4:
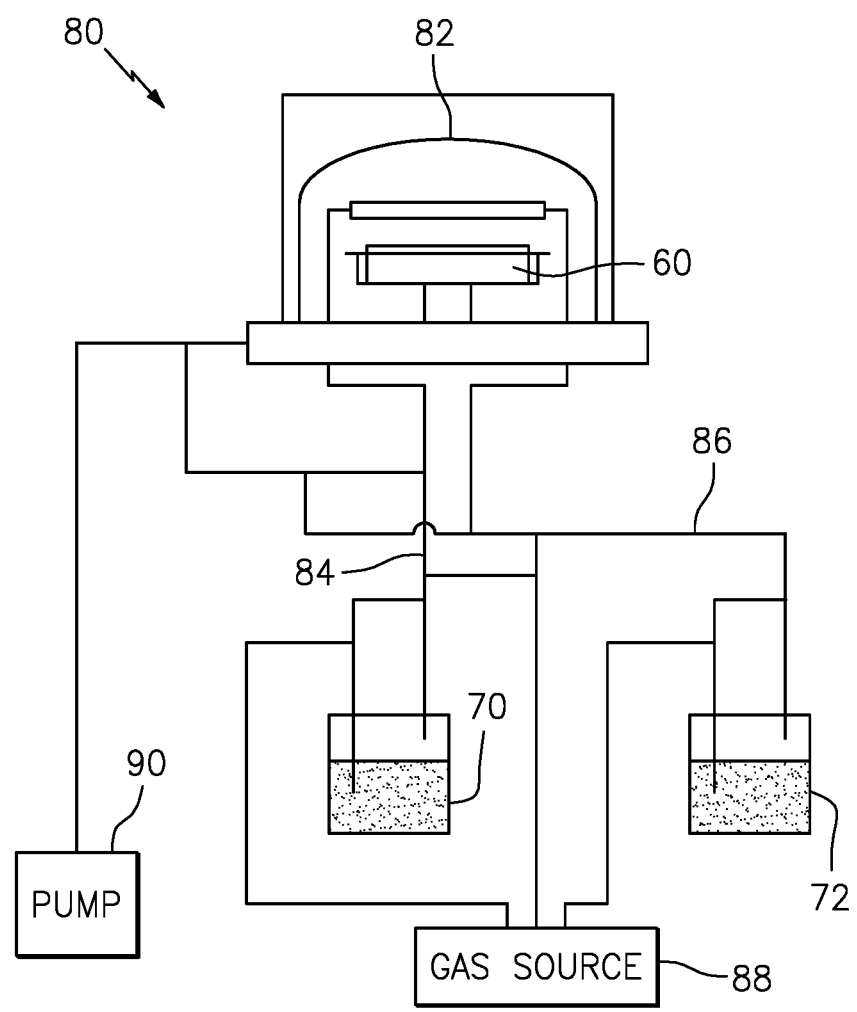
FIG. 4 is a schematic of an exemplary atomic layer coating apparatus
Figure 5:
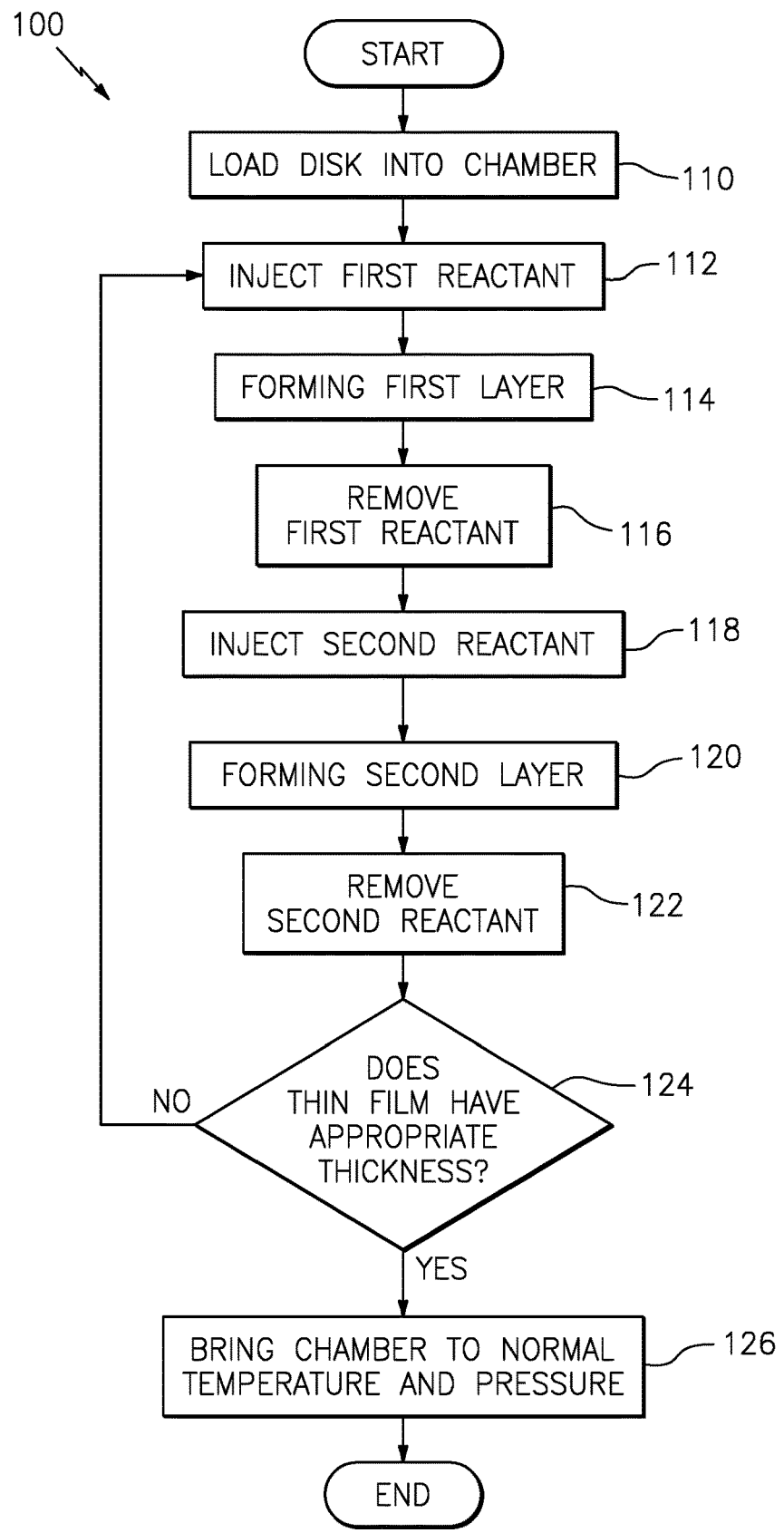
FIG. 5 is an exemplary process map.

Referring also to FIGS. 4 and 5, ALD is a form of chemical vapor deposition (CVD) in which alternating precursor chemicals, such as a first reactant 70 and a second reactant 72 are introduced into a chamber 82, take part in a surface-limited chemical reaction, and build up a coating in an A-B-A-B-A-B layered manner. In an exemplary embodiment the precursor gases are introduced as A-B-A-B. The actual protective barrier coating 66, in this case, is not a layered structure, but a single oxide phase. The first reactant adsorbs on the surface as a gas, the second reactant is specifically designed to react with the first reactant to form a stable compound, such as $Cr_2O_3$. In exemplary embodiments, the chamber 82 can be a vacuum chamber or low pressure chamber or an atmospheric chamber, set to a predetermined atmospheric pressure.

The coating 66 can include a first monolayer thin film 74 on the outer surface 64, and a second layer 76 formed on the first monolayer thin film 74. The first monolayer thin film 74 is laid down from the first reactant A as a gas. The first reactant will form a solid after it reacts with the second reactant B and forms the monolayer thin film 74. In the exemplary embodiment shown at FIG. 3, layers 68 are shown as two layers, it is contemplated that multiple layers 68 can be utilized. In exemplary embodiments, the reaction sequence is A-B-A-B-A-B, but the protective barrier coating 66 may not be explicitly built up of monolayers of A and B as the second reactant 72 (reactant B) can react with the 'monolayer' of the first reactant 70 (reactant A) to form the protective barrier coating 66.

In other exemplary embodiments, not every cycle of the reaction sequence can involve adsorption or reaction of a complete monolayer, therefore the term monolayer can include both full monolayers and partial monolayer structure. In other exemplary embodiments, the multiple layers 68 can comprise multiple layers of the same chemistry, and in another exemplary embodiments the multiple layers 68 can be varied chemistries, such as $Al_2O_3/Cr_2O_3$. For example, the multiple layers 68 can comprise one or more layers of oxide A followed by one or more layers of oxide B or alternatively, alternating one or more layers of oxide A and one or more layers oxide B. In another exemplary embodiment, the multiple layers 68 can include more than two chemistries as are embodiments where two discretely deposited chemistries diffuse together to form a single phase.

The first reactant 70 can include an oxide precursor and the second reactant 72 can include an oxidant. Examples of the first reactant 70 can be selected from available precursors for the desired metal (oxide) phase(s), for example, Me-halides (for example Al(Cl)3), alkyls (such as, trimethyl aluminum), alkoxides (such as, aluminum ethoxide), β-diketonates (such as, aluminum acetylacetonate) are among the more common classes of precursors, where Me=Al, Cr, Ti, Si, Zr, Hf, Y, Ta, Nb, Ce, La, Yb, Mg, Ni, Co, Mn.

In another exemplary embodiment, when the protective barrier coating 66 is an oxide, then the second reactant 72 can be water, molecular oxygen (02), and ozone (03). In another embodiment, atomic oxygen (such as, oxygen plasma) could also be an option, but due to line of sight issues may be a less likely option.

$Cr_2O_3$ is generally favorable for hot corrosion resistance, i.e., corrosion in the approximately 1200-1800 degrees Fahrenheit range in the presence of corrosive salt deposits. In typical disk applications, disk rims 62 will not exceed approximately 1300 degree Fahrenheit, and hot corrosion is expected to be the primary failure mode. In another exemplary embodiment, alternative ceramic coatings could be utilized, such as $Al_2O_3$ as well as oxide and nitride compounds, and oxides selected from the list of precursors above, including multiphase or mixed oxides containing two or more components, and the like.

In an exemplary embodiment a thickness T can range from about a 0.1-10 micron range. In an exemplary embodiment, a certain thickness is desired to give adequate environmental protection, which establishes the lower limit. In an exemplary embodiment an upper limit can be defined by two factors. First, particularly in the case of disks, the component is very sensitive to fatigue, and the fatigue debit associated with a coating generally trends with coating thickness. The thinner the coating the better, from a fatigue standpoint. Secondly, ALD is a relatively slow process, so there is a practical limit to how long a part can be in a coating device.

Referring also to FIGS. 4 and 5, the exemplary process 100 is illustrated with reference to the exemplary coating apparatus 80. The disk 60 can be placed in a chamber 82, at step 110. The chamber 82 is configured to perform atomic layer deposition. After the chamber temperature and pressure have been established, the first reactant 70 can be injected into the chamber 82 through line 84, at step 112. The first reactant 70 can nominally form a first monolayer gas thin film 74 on the outer surface 64, at step 114. At step 116, the first reactant 70 is removed from the chamber 82.

The second reactant 72 can be injected into the chamber 82 through line 86, at step 118. The second reactant 72 can react with the adsorbed first monolayer gas thin film 74 to form a solid layer, at step 120, resulting in a protective barrier coating 66. At step 122, the second reactant 72 is removed from the chamber 82.

At step 124, the thickness of protective barrier coating 66 is determined. If the thickness is not appropriate according to predetermined values, the steps of forming the first monolayer thin film 114—including step 112—and forming said second layer 120—including steps 116 and 118—can be repeated. The determination to repeat steps 112 through 122 is responsive to determining that the thickness of the protective barrier coating 66 is not within the specifications of the predetermined value, usually being too thin.

The chamber 82 can be returned to normal temperature and pressure at step 126. In another exemplary embodiment, in-situ thickness monitoring techniques such as ellipsometry and quartz crystal microbalance (QCM) can be employed for ALD. These techniques allow the process to be monitored in real-time and the process can be stopped when a desired thickness is reached without having to heat up/cool down the chamber.

In an exemplary embodiment a gas source 88 can be coupled to the first reactant 70 supply and second reactant 72 supply. Optionally, a vacuum pump 90 can be coupled to the chamber 82 and lines 84, 86 to enable the coating system 80 to operate under vacuum/low pressure as required.

The exemplary coating process involves atomic layer deposition (ALD) of oxides to form the nanometer-scale layers 68. Atomic layer deposition is one method that can be used to deposit thin, conformal, defect free metallic and ceramic coating 66 to complex geometries with excellent thickness control and complete non-line-of-sight capability.

The exemplary process forms a thin protective barrier coating 66 that is required which can protect a powder alloy of the disk 60 from corrosive salt deposits, while causing a minimal debit to high cycle fatigue/low cycle fatigue/thermo-mechanical fatigue.

The protective barrier coating has a thickness configured to minimize a fatigue debit of the disk.

The protective barrier coating of $Cr_2O_3$ material includes the advantage of having reasonable chemical stability in the presence of molten sulfates at elevated temperatures seen proximate the turbine disks.

The protective barrier coating as formed by the process herein includes the advantages of increased engine time on wing and, reduced scrap rates for costly long lead-time parts.

The protective barrier coating as formed by the process herein includes the advantage of a non-line-of-sight coating technique.

The protective barrier coating as formed by the process herein includes the advantage of having the capacity to deposit oxide/nitride layers which can act as effective barriers to salt deposits.

The protective barrier coating as formed by the process herein includes the advantage of depositing thin layers that minimize fatigue debits.

The protective barrier coating as formed by the process herein includes the advantage of having low part temperatures during the coating process, typically a few hundred degrees Centigrade. In alternative embodiments, one can deposit the protective barrier coating as close to the ultimate use temperature as possible. ALD is generally kept to lower temperatures because it is preferred to work below the thermal decomposition limits of the ALD precursors.

There has been provided a process for coating. While the process for coating has been described in the context of specific embodiments thereof, other unforeseen alternatives, modifications, and variations may become apparent to those skilled in the art having read the foregoing description. Accordingly, it is intended to embrace those alternatives, modifications, and variations which fall within the broad scope of the appended claims.

What is claimed is:

1. A process for coating a gas turbine engine disk comprising:
   placing said disk having an alloy substrate having an outer surface into a chamber, said chamber configured to perform atomic layer deposition;
   injecting a first reactant into said chamber, so as to form a first monolayer gas thin film directly on said disk;
   removing said first reactant from said chamber;
   injecting a second reactant into said chamber, so as to react with said first monolayer gas thin film to form a first monolayer solid thin film on said outer surface;
   removing said second reactant from said chamber; and
   forming a single oxide phase protective barrier coating directly on said disk; wherein said first monolayer gas thin film and a second monolayer solid thin film comprise a total thickness of from 0.1 micron to 10 microns.

2. The process of claim 1, further comprising:
   determining a thickness of said protective barrier coating; and
   repeating the steps of injecting and removing said first reactant and repeating the step of injecting and removing said second reactant responsive to determining said thickness of said protective barrier coating.

3. The process of claim 1, further comprising:
   prior to injecting said first reactant into said chamber, creating a vacuum in said chamber; and
   heating said chamber to a predetermined temperature.

4. The process of claim 3, wherein said predetermined temperature enables said step of forming a first monolayer gas thin film on said internal surfaces and said step of injecting said second reactant to form said monolayer solid thin film.

5. The process of claim 1, wherein said first reactant comprises an oxide precursor and said second reactant comprises an oxidant.

6. The process of claim 1, wherein said first monolayer solid thin film and said second monolayer solid thin film form a protective barrier coating comprising $Cr_2O_3$.

7. The process of claim 1, wherein said first monolayer gas thin film and said second reactant form said protective barrier coating comprising a material selected from the group consisting of $Al_2O_3$.

8. The process of claim 1, wherein said outer surface is proximate a rim of said disk.

9. The process of claim 1, wherein said gas turbine engine disk is selected from the group consisting of a high pressure compressor disk and a high pressure turbine disk.

10. A gas turbine engine disk comprising:
    a protective barrier coating formed directly on the disk by the process of claim 1.

11. The gas turbine engine disk according to claim 10, wherein said protective barrier coating comprises $Cr_2O_3$.

12. The gas turbine engine disk according to claim 10, wherein said protective barrier coating is a material selected from the group consisting of $Al_2O_3$.

13. The gas turbine engine disk according to claim 10, wherein said disk is at least one of a bladed disk and an integrally bladed rotor disk.

14. The gas turbine engine disk according to claim 10, wherein said protective barrier coating has a thickness configured to minimize a fatigue debit of the disk.

\* \* \* \* \*